United States Patent
Kwan et al.

(10) Patent No.: US 11,843,047 B2
(45) Date of Patent: Dec. 12, 2023

(54) INTEGRATION OF P-CHANNEL AND N-CHANNEL E-FET III-V DEVICES WITHOUT PARASITIC CHANNELS

(71) Applicant: Taiwan Semiconductor Manufacturing Company, Ltd., Hsin-Chu (TW)

(72) Inventors: Man-Ho Kwan, Kowloon (HK); Fu-Wei Yao, Hsinchu (TW); Chun Lin Tsai, Hsin-Chu (TW); Jiun-Lei Jerry Yu, Zhudong Township (TW); Ting-Fu Chang, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/751,849

(22) Filed: May 24, 2022

(65) Prior Publication Data

US 2022/0285540 A1    Sep. 8, 2022

Related U.S. Application Data

(62) Division of application No. 16/589,440, filed on Oct. 1, 2019, now Pat. No. 11,349,023.

(51) Int. Cl.
*H01L 29/10* (2006.01)
*H01L 29/06* (2006.01)
(Continued)

(52) U.S. Cl.
CPC ...... *H01L 29/7787* (2013.01); *H01L 29/0642* (2013.01); *H01L 29/1029* (2013.01); *H01L 29/42316* (2013.01); *H01L 29/66462* (2013.01)

(58) Field of Classification Search
CPC ............ H01L 29/7787; H01L 29/0642; H01L 29/1029; H01L 29/42316; H01L 29/66462
See application file for complete search history.

(56) References Cited

U.S. PATENT DOCUMENTS 5,479,033 A    12/1995  Baca et al.
7,352,008 B2    4/2008  Kohn et al.
(Continued)

FOREIGN PATENT DOCUMENTS

EP    0297508 A2 *  1/1989

OTHER PUBLICATIONS

Kiehl et al., "Complementary p-MODFET and n-HB MESFET (Al,Ga)As Transistors" IEEE Electron Device Letters; vol. EDL-5, No. 12, Dec. 1984.*
(Continued)

*Primary Examiner* — Peter Bradford
(74) *Attorney, Agent, or Firm* — Eschweiler & Potashnik, LLC

(57) ABSTRACT

In some embodiments, the present disclosure relates to an integrated transistor device, including a first barrier layer arranged over a substrate. Further, an undoped layer may be arranged over the first barrier layer and have a n-channel device region laterally next to a p-channel device region. The n-channel device region of the undoped layer has a topmost surface that is above a topmost surface of the p-channel device region of the undoped layer. The integrated transistor device may further comprise a second barrier layer over the n-channel device region of the undoped layer. A first gate electrode is arranged over the second barrier layer, and a second gate electrode is arranged over the p-channel device region of the undoped layer.

20 Claims, 11 Drawing Sheets

(51) Int. Cl.
  *H01L 29/423* (2006.01)
  *H01L 29/778* (2006.01)
  *H01L 29/66* (2006.01)

(56) References Cited

U.S. PATENT DOCUMENTS

2007/0295991 A1  12/2007  Kato et al.
2012/0126291 A1  5/2012   Mitsunaga et al.
2019/0051649 A1  2/2019   Mitsunaga

OTHER PUBLICATIONS

Sun et al. "Substantiation of Buried Two Dimensional Hole Gas (2DHG) Existence in GaN-on-Si Epitaxial Heterostructure." Appl. Phys. Lett. 110, 163506 (2017); doi: 10.1063/1.4980140. Published on Apr. 20, 2017.
Wikipedia.org "Depletion and Enhancement Modes." Published on Mar. 25, 2019.
Bachmann, K.J. "Epitaxial Growth: An Overview." From In Situ Characterization of Thin Film Growth, published in 2011.
Semiconductor Engineering. "Epitaxy: A Method for Growing or Depositing Mono Crystalline." The date of publication is unknown. Retrieved online on Jun. 28, 2019 from https://semiengineering.com/knowledge_centers/manufacturing/process/epitaxy/.
Wikipedia.org "Epitaxy." Published on May 24, 2019.
Wikipedia.org "High-Electron-Mobility Transistor." Published on Jan. 2, 2019.
Heikman et al. "Polarization Effects in AlGaN/GaN and GaN/AlGaN Heterostructures." Journal of Applied Physics, 93(12), published on Jun. 1, 2003.
Liu et al. "Characterization of Two-Dimensional Hole Gas at GaN/AlGaN Heterointerface." The 1st IEEE Workshop on Wide Bandgap Power Devices and Applications, published on Jan. 6, 2014.
Non-Final Office Action dated Sep. 8, 2021 for U.S. Appl. No. 16/589,440.
Notice of Allowance dated Feb. 2, 2022 for U.S. Appl. No. 16/589,440.

* cited by examiner

INTEGRATION OF P-CHANNEL AND N-CHANNEL E-FET III-V DEVICES WITHOUT PARASITIC CHANNELS

REFERENCE TO RELATED APPLICATION

This Application is a Divisional of U.S. application Ser. No. 16/589,440, filed on Oct. 1, 2019, the contents of which are hereby incorporated by reference in their entirety.

BACKGROUND

Modern day integrated chips comprise millions or billions of semiconductor devices formed on a semiconductor substrate (e.g., silicon). Integrated chips (ICs) may use many different types of transistor devices, depending on an application of an IC. In recent years, the increasing market for cellular and RF (radio frequency) devices has resulted in a significant increase in the use of high voltage transistor devices. Thus, high electron mobility transistor (HEMT) devices have been receiving increased attention due to high electron mobility and wide band gaps compared to silicon-based semiconductor devices. Such high electron mobility and wide band gaps allow improved performance (e.g., fast switching speeds, low noise) and high temperature applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
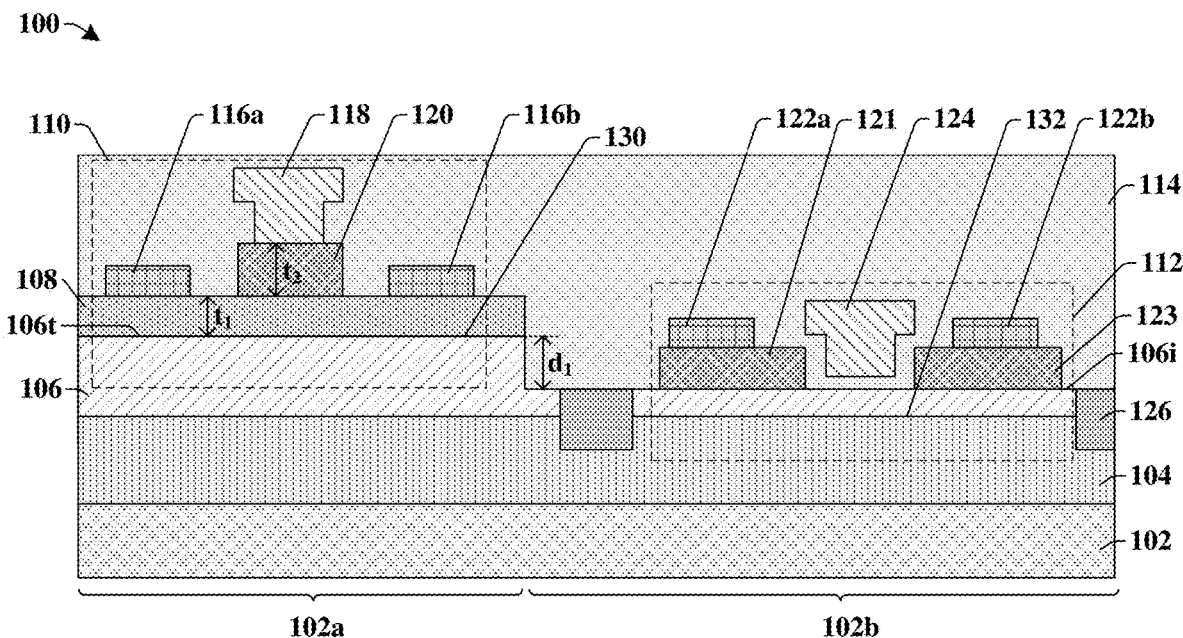
FIG. 1 illustrates a cross-sectional view of some embodiments of an integrated high electron mobility transistor (HEMT) device having an n-channel device and a p-channel device on a same substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A high electron mobility transistor (HEMT) device includes a heterojunction which is at an interface between two materials having different band gaps and which acts as a channel region of the HEMT device. In an enhancement mode device (e.g., an enhancement-mode field effect transistor (E-FET)), the HEMT device uses a gate to source voltage to switch the HEMT device "ON" (e.g., to "turn on" current between source and drain). In a depletion mode device (e.g., a depletion-mode field effect transistor (D-FET)), the HEMT device uses a gate to source voltage to switch the device "OFF" (e.g., to "turn off" current between source and drain).

For example, in the enhancement mode for n-channel HEMT devices, the conduction band at the heterojunction has a sharp valley that drops below and intersects the Fermi level, thereby forming a two-dimensional electron gas (2DEG) at the heterojunction when a gate to source voltage is applied. For example, in the enhancement mode for p-channel HEMT devices, the valence band at the heterojunction exhibits a peak that is above and intersects the Fermi level, thereby forming a two-dimensional hole gas (2DHG) at the heterojunction when a gate to source voltage is applied. In some applications, a p-channel HEMT device and an n-channel HEMT device are integrated onto a same substrate. However, parasitic 2DEGs and 2DHGs may form, interfere with desired 2DEGs and 2DHGs, and degrade device performance.

In some embodiments of an integrated HEMT device, a first undoped III-V layer may be disposed over a substrate, and a barrier layer may be disposed over the first undoped III-V layer. On an n-channel device region of the substrate, an n-channel device may be disposed, comprising, in part a second undoped III-V layer over the barrier layer. In the enhancement mode, a desired 2DEG in the n-channel device may form between the barrier layer and the first undoped III-V layer. However, an undesired, parasitic 2DHG may also form between the second undoped III-V layer and the barrier layer. The parasitic 2DHG may interact with the desired 2DEG, assist in electron-hole recombination, and thus, reduce the carrier density of the desired 2DEG. Further, the parasitic 2DHG may cause the sheet resistance of the 2DEG to decrease and also cause leakage when the device is "OFF", degrading device performance.

On a p-channel device region of the substrate laterally beside the n-channel device region, a p-channel device may be disposed, comprising, in part, a third undoped III-V layer over the barrier layer. In the enhancement mode, a desired 2DHG in the p-channel device may form between the third undoped III-V layer and the barrier layer. However, an undesired, parasitic 2DEG may also form between the barrier layer and the first undoped III-V layer. The parasitic 2DEG may interact with the desired 2DHG, assist in electron-hole recombination, and thus, reduce the carrier density of the desired 2DHG. Further, the parasitic 2DEG may cause the sheet resistance of the 2DHG to decrease and also cause leakage when the device is "OFF", degrading device performance.

Various embodiments of the present disclosure provide a method and corresponding structure of an integrated HEMT device that eliminates undesired, parasitic channels to produce a reliable integrated HEMT device. In some embodiments, a first barrier layer is formed over a substrate, a first undoped layer is formed over the first barrier layer, a second barrier layer is formed over the first undoped layer, and a first doped layer is formed over the second barrier layer. A selective etch is performed to remove the first doped layer, the second barrier layer, and an upper portion of the first undoped layer on a p-channel device region of the substrate. On a lower portion of the first undoped layer on the p-channel device region of the substrate, a second doped layer is grown through an epitaxial growth process. Remaining contacts, gate electrodes, and isolation structures are formed, such an n-channel device is on an n-channel device region of the substrate, and a p-channel device is on a p-channel device region of the substrate.

In such embodiments, a parasitic 2DHG channel is deterred or prevented from forming in the n-channel device because the second barrier layer is thin (e.g., less than 30 nanometers), thereby deterring or preventing the valence band from intersecting with the Fermi level at an interface between the first doped layer and the second barrier layer. A parasitic 2DEG channel is deterred or prevented from forming in the p-channel device because the first barrier layer is over and directly contacts the substrate, not an undoped layer, and thus, a heterojunction is not formed. Therefore, the disclosed method of forming an integrated HEMT device deters or prevents the formation of parasitic channels, thereby producing a reliable integrated HEMT device without compromising carrier density, sheet resistance, or ON/OFF gate control, for example.

FIG. 1 illustrates a cross-sectional view 100 of some embodiments of an integrated HEMT device comprising an n-channel device and a p-channel device.

The integrated HEMT device in the cross-sectional view 100 includes, in some embodiments, a first barrier layer 104 disposed over a substrate 102. In some embodiments, the first barrier layer 104 may comprise a III-V semiconductor material, such as, for example, indium aluminum gallium nitride (e.g., $In_xAl_yGa_{1-x-y}N$, wherein x+y=1, and wherein x may range from 0 to 1). In some embodiments, the substrate 102 may comprise, for example, silicon, silicon carbide, or sapphire. A first undoped layer 106 may be disposed over the first barrier layer 104. In some embodiments, the first undoped layer 106 may comprise a binary III-V semiconductor material, such as, for example, aluminum nitride, gallium nitride, or indium nitride. In some embodiments, on a n-channel device region 102a of the substrate 102, the first undoped layer 106 has a topmost surface 106t that is above an intermediate upper surface 106i of the first undoped layer 106 on a p-channel device region 102b of the substrate 102. In some embodiments, the topmost surface 106t of the first undoped layer 106 may be at a first distance $d_1$ higher than the intermediate upper surface 106i of the first undoped layer 106. For example, in some embodiments, the first distance $d_1$ may be in a range of between approximately 290 nanometers and approximately 990 nanometers. The first undoped layer 106 may have different thicknesses because the p-channel device region 102b, in some embodiments, uses a thinner first undoped layer 106 than the n-channel device region 102a of the substrate 102. In some embodiments, the first undoped layer 106 has a bottommost surface that is substantially coplanar.

In some embodiments, on the n-channel device region 102a of the substrate 102, an n-channel device 110 may be disposed. The n-channel device 110 may include a second barrier layer 108 over the topmost surface 106t of the first undoped layer 106. In some embodiments, the second barrier layer 108 may comprise a quaternary III-V semiconductor material, such as, for example indium aluminum gallium nitride (e.g., $In_mAl_nGa_{1-m-n}N$, wherein m+n=1, and wherein m may range from 0 to 1). Thus, in some embodiments, the first barrier layer 104 may comprise a same material with same concentrations of each element (e.g., x=m and y=n) as the second barrier layer 108, whereas in other embodiments, the first barrier layer 104 may comprise different concentrations of each element (e.g., x≠m and y≠n) than the second barrier layer 108. Thus, in some embodiments, the substrate 102 may comprise silicon, the first barrier layer 104 may comprise indium aluminum gallium nitride, the first undoped layer 106 may comprise indium nitride, and the second barrier layer 108 may comprise indium aluminum gallium nitride. In some embodiments, a first contact 116a and a second contact 116b may be arranged over the second barrier layer 108 and spaced apart from one another by a first doped layer 120. In some embodiments, the first doped layer 120 may comprise a same material as the first undoped layer 106; however, the first doped layer 120 also has a doping concentration. Thus, in some embodiments, the first doped layer 120 may comprise doped indium nitride. In some embodiments, the first doped layer 120 may correspond to a doped binary III-V gate region. A first gate electrode 118 may be arranged over the first doped layer 120, between the first and second contacts 116a, 116b, and surrounded by a dielectric structure 114.

In enhancement mode, a two-dimensional electron gas (2DEG) may form along a first heterojunction 130 at the interface between the first undoped layer 106 and the second barrier layer 108 due to a difference in band gap between the first undoped layer 106 and the second barrier layer 108. In some embodiments, a parasitic two-dimensional hole gas (2DHG) is not formed at an interface between the second barrier layer 108 and the first doped layer 120 at an interface between the first undoped layer 106 and the first barrier layer 104 because the second barrier layer 108 is sufficiently thin. For example, in some embodiments, the second barrier layer 108 may have a first thickness $t_1$ that is less than approximately 20 nanometers. In other embodiments, the second barrier layer 108 may have a first thickness $t_1$ that is less than approximately 30 nanometers. In some embodiments, the first thickness $t_1$ of the second barrier layer 108 that effectively prevents the formation of the parasitic 2DHG may depend on the concentration of each element in the second barrier layer 108. Further, in some embodiments, the parasitic 2DHG may not form on the n-channel device region 102a of the substrate 102 because the first doped layer 120 may be sufficiently thin and/or have a sufficiently low p-type dopant concentration. For example, in some embodiments, the first doped layer 120 may have a second thickness $t_2$ that is less than 30 nanometers, and/or may comprise a dopant concentration of approximately $10^{18}$ p-type dopants per cubic centimeter. Thus, in some embodiments, the first thickness $t_1$ of the second barrier layer 108, the concentration of each element in the second barrier layer 108, the second thickness $t_2$ of the first doped layer 120, and/or the dopant concentration of the first doped layer 120 may be designed such that the conduction band is below the Fermi level at the interface between the second barrier layer 108 and the first undoped layer 106 to form a 2DEG, while a 2DHG is not formed. Therefore, the n-channel device 110 may utilize the 2DEG along the first heterojunction 130 without interference from a parasitic 2DHG.

In some embodiments, on the p-channel device region 102b of the substrate 102, a p-channel device 112 may be disposed. The p-channel device 112 may include a second doped layer 121 arranged over the intermediate upper surface 106i of the first undoped layer 106. A third doped layer 123 may also be arranged over the intermediate upper surface 106i of the first undoped layer 106 and spaced apart from the second doped layer 121 by a second gate electrode 124. In some embodiments, the second doped layer and the third doped layer 123 may respectively correspond to a doped binary III-V source region and a doped binary III-V drain region, such that the second gate electrode 124 is arranged between the doped binary III-V source region (e.g., 121) and the doped binary III-V drain region (e.g., 123). In some embodiments, the second gate electrode 124 is spaced apart from the intermediate upper surface 106i of the first undoped layer 106 by the dielectric structure 114. In some embodiments, a third contact 122a and a fourth contact 122b may be arranged over the second doped layer 121 and the third doped layer 123, respectively.

In enhancement mode, a two-dimensional hole gas (2DHG) may form along a second heterojunction 132 at the interface between the first undoped layer 106 and the first barrier layer 104. In some embodiments, the 2DHG forms because, in part, the first undoped layer 106 on the p-channel device region 102b of the substrate 102 has a thickness in a range of between, for example, approximately 10 nanometers and approximately 30 nanometers, thereby causing the valence band at the second heterojunction 132 to exhibit a peak that is above and intersects the Fermi level. If the first undoped layer 106 on the p-channel device region 102b of the substrate 106 has a thickness greater than 30 nanometers, in some embodiments, the 2DHG may not form at the second heterojunction 132 in enhancement mode. Further, in some embodiments, the 2DHG may form along the second heterojunction 132 due to, in part, the concentration of elements of the first barrier layer 104. A parasitic 2DEG is not formed in the p-channel device 112 because on the p-channel device region 102b of the substrate 102, the first barrier layer 104 does not overlie an undoped layer. Instead, the first undoped layer 106 is above the first barrier layer 104, thereby forming a 2DHG, not a 2DEG. Thus, the p-channel device may utilize the 2DHG along the second heterojunction 132 without interference from a parasitic 2DEG.

Thus, in some embodiments, the p-channel device 112 and the n-channel device 110 may be integrated on the same substrate 102 without the formation of parasitic 2DHG and 2DHGs. Further, isolation regions 126 may surround the p-channel device 112 such that the p-channel device 112 is isolated from the n-channel device 110. In some embodiments, the isolation regions 126 may extend through the first undoped layer 106 and into at least part of the first barrier layer 104, such that the isolation regions 126 intersect with the second heterojunction 132. Thus, in enhancement mode, the isolation regions 126 prevent the 2DEG along the first heterojunction 130 in the n-channel device 110 from interfering with the 2DHG along the second heterojunction 132 in the p-channel device 112.

Figure 2:
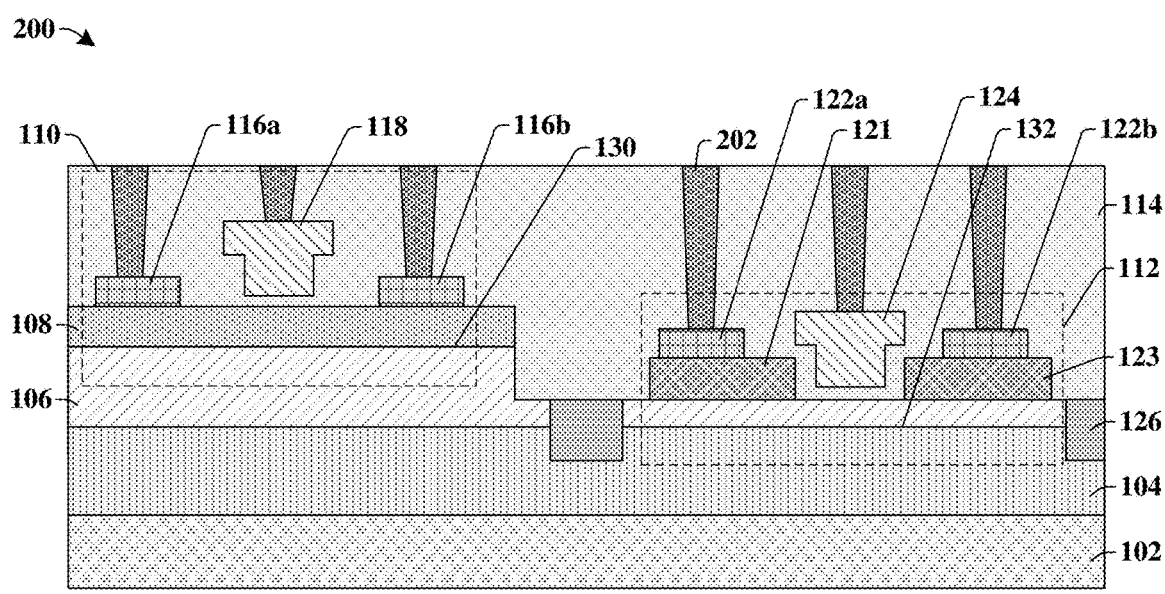
FIG. 2 illustrates a cross-sectional view of some additional embodiments of an integrated HEMT device having an n-channel device and a p-channel device on a same substrate.

FIG. 2 illustrates a cross-sectional view 200 of some other embodiments of an integrated HEMT device comprising an n-channel device and a p-channel device.

The integrated HEMT device in the cross-sectional view 200 includes contact vias 202 embedded within the dielectric structure 114. Each of the first contact 116a, the first gate electrode 118, the second contact 116b, the second gate electrode 124, and the third contact 122a may be coupled to one of the contact vias 202. The contact vias 202 may be coupled to voltage sources to control the operation (e.g., "ON," "OFF") of the n-channel device 110 and the p-channel device 112. In some embodiments, up to 20 volts may applied across the n-channel device 110 and the p-channel device 112 through the contact vias 202. In other embodiments, the voltage bias applied to the n-channel device 110 and the p-channel device 112 may be in a range of between, for example, approximately 1 volt and approximately 12 volts. Additionally, unlike the cross-sectional view 100 in FIG. 1, in some embodiments, the first doped layer (120 of FIG. 1) may be omitted, such that the first gate electrode 118 directly contacts the dielectric structure 114, wherein the dielectric structure 114 separates the first gate electrode 118 from the second barrier layer 108. In such embodiments without the first doped layer (120 of FIG. 1) beneath the first gate electrode 118, the n-channel device 110 may be a depletion mode device, wherein an applied voltage bias to the first gate electrode 118 causes the n-channel device 110 to turn "OFF."

Figure 3:
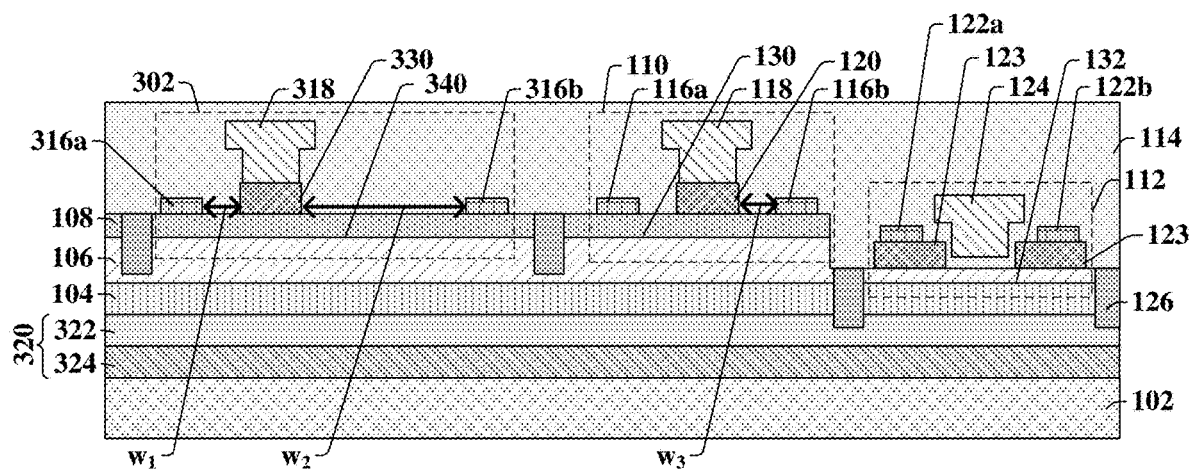
FIG. 3 illustrates a cross-sectional view of some embodiments of an integrated HEMT device having a high-voltage power device, an n-channel device, and a p-channel device on a same substrate.

FIG. 3 illustrates a cross-sectional view 300 of some embodiments of an integrated HEMT device comprising an n-channel device, a p-channel device, and a high-voltage power device.

The integrated HEMT device in the cross-sectional view 300 includes the n-channel device 110 and the p-channel device 112 integrated over the same substrate 102. Further, in some embodiments, a high-voltage power device 302 may be arranged over the substrate 102 and laterally next to the n-channel device 110 and the p-channel device 112. In some embodiments, the high-voltage power device 302 may operate using voltages greater than 100 volts. For example, in some embodiments, the high-voltage power device 302 may operate using a voltage in a range of between approximately 100 volts and approximately 1000 volts. Thus, in some embodiments, the high-voltage power device 302 may operate using a voltage that is between 100 and 1000 times greater than a voltage that is applied to the n-channel device 110 and/or the p-channel device 112.

In the cross-sectional view 300, the high-voltage power device 302 may be an n-channel, enhancement mode device. Thus, the high-voltage power device 302 may comprise a fifth contact 316a and a sixth contact 316b arranged over the second barrier layer 108, and, in some embodiments, a fourth doped layer 330 may separate the fifth contact 316a from the sixth contact 316b. The fourth doped layer 330 may directly contact the second barrier layer 108. In some embodiments, a third gate electrode 318 is arranged over the fourth doped layer 330.

In some embodiments, to accommodate for operation voltages greater than 100 volts, the sixth contact 316b may be spaced from the fourth doped layer 330 and/or third gate electrode 318 by a second width $w_2$ that is greater than a first width $w_1$ between the fifth contact 316a and the fourth doped layer 330 and/or the third gate electrode 318. The fifth contact 316a may correspond to a source region of the high-voltage power device 302, and the sixth contact 316b may correspond to a drain region of the high-voltage power device 302. Similarly, the first contact 116a of the n-channel device 110 may correspond to a source region of the n-channel device 110, and the second contact 116b of the n-channel device 110 may correspond to a drain region of the n-channel device 110. The second contact 116b of the n-channel device 110 may be spaced from the first doped layer 120 and/or the first gate electrode 118 by a third width $w_3$. In some embodiments, the second width $w_2$ may be greater than the third width $w_3$ because the high-power voltage device 302 utilizes higher operating voltages than the n-channel device 110.

Like the n-channel device 110, in the high-voltage power device 302, upon a sufficient voltage bias applied to the third gate electrode 318, a 2DEG may form at the interface, or third heterojunction 340, between the second barrier layer 108 and the first undoped layer 106. The isolation regions 126 may separate the third heterojunction 340 from the first heterojunction 130 in order to isolate the high-voltage power device 302 from the n-channel device 110. In other embodiments, the high-voltage power device 302 may be directly adjacent to the p-channel device 112, and thus, the isolation regions 126 may separate the third heterojunction 340 from the second heterojunction 132.

In some embodiments, a buffer stack 320 may be disposed between the substrate 102 and the first barrier layer 104. The buffer stack 320 may comprise a second buffer layer 322 over a first buffer layer 324. The first buffer layer 324 and the second buffer layer 322 may each comprise indium aluminum gallium arsenide. In some embodiments, the first and second buffer layers 324, 322 may comprise the same concentrations of each element, different concentrations of each element, or a combination thereof. The buffer stack 320 may reduce vertical electrical field effects caused by the high-voltage power device 302. The total number of layers in the buffer stack 320 may depend on the operating voltage used to operate the high-voltage power device 302. For example, in some embodiments, if the operating voltage of the high-voltage power device 302 is 500 volts, a first number of layers may be used in the buffer stack 320, whereas if the operating voltage of the high-voltage power device 302 is 100 volts, a second number of layers less than the first number of layers may be used in the buffer stack 320. Nevertheless, the buffer stack 320 allows the high-voltage power device 302 to withstand and sustain its high voltage, without interfering with the first and second heterojunctions 130, 132 of the n-channel and p-channel devices 110, 112, respectively.

FIGS. 4-20 illustrate cross-sectional views 400-2000 of some embodiments of a method of forming an integrated HEMT device comprising an n-channel device and p-channel device on a same substrate. Although FIGS. 4-20 are described in relation to a method, it will be appreciated that the structures disclosed in FIGS. 4-20 are not limited to such a method, but instead may stand alone as structures independent of the method.

Figure 4:
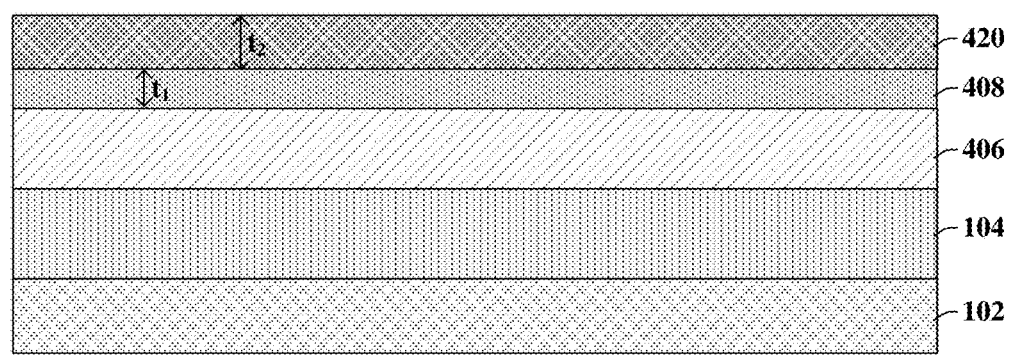
FIGS. 4-20 illustrate cross-sectional views of some embodiments of a method of forming an integrated HEMT device having an n-channel device and a p-channel device on a same substrate.

As shown in the cross-sectional view 400 of FIG. 4, a substrate 102 is provided. In some embodiments, the substrate 102 comprises silicon, sapphire, or silicon carbide. In some embodiments, the substrate 102 may comprise p-type silicon, which is a widely available substrate and therefore reduces the cost of the HEMT device. A first barrier layer 104 may be deposited over the substrate 102. In some embodiments, the first barrier layer 104 may comprise a quaternary III-V semiconductor material, such as, for example, indium aluminum gallium arsenide. The first barrier layer 104 may have a thickness in a range of between approximately 20 nanometers and approximately 50 nanometers. A first undoped material 406 may be deposited over and directly contact the first barrier layer 104. The first undoped material 406 may comprise a III-V semiconductor material, or a III-N semiconductor material, such as, for example, aluminum nitride, indium nitride, gallium nitride, or the like. In some embodiments, the first undoped material 406 may have a thickness in a range of between approximately 0.3 micrometers and approximately 1 micrometer. A second barrier material 408 may be deposited over the first undoped material 406. In some embodiments, the second barrier material 408 may comprise a quaternary III-V semiconductor material, such as, for example, indium aluminum gallium arsenide. In some embodiments, the second barrier material 408 may comprise different concentrations of each element in the indium aluminum gallium arsenide than the first barrier layer 104, whereas in other embodiments, the second barrier material 408 may comprise the same concentrations of each element in the indium aluminum gallium arsenide as the first barrier layer 104. In some embodiments, the second barrier material 408 may have a first thickness $t_1$ that is in a range of between approximately 10 nanometers and approximately 30 nanometers. Thus, in some embodiments, the second barrier material 408 may be thinner than the first barrier layer 104. The first thickness $t_1$ may be less than 30 nanometers to prevent parasitic channels from forming in n-channel devices to be formed over the substrate 102 (see, 110 of FIG. 1).

In some embodiments, a doped material 420 may be deposited over the second barrier material 408. The doped material 420 may comprise a same material as the first undoped material 406, but with a doping concentration. For example, in some embodiments, the doped material 420 may comprise a p-type III-V semiconductor material, such as, for example, aluminum nitride, indium nitride, gallium nitride, or the like. In some embodiments, the doped material 420 is lightly doped (e.g., less than $10^{18}$ dopants per cubic centimeter) to prevent parasitic channels from forming in n-channel devices to be formed over the substrate 102 (see, 110 of FIG. 1). Similarly, in some embodiments, the doped material 420 may have a second thickness $t_2$ that is less than 30 nanometers to prevent parasitic channels from forming in n-channel devices to be formed over the substrate 102 (see, 110 of FIG. 1). In other embodiments, it will be appreciated that the doped material 420 may be omitted, such in embodiments comprising an n-channel device (110 of FIG. 2) that is a depletion mode device, as in FIG. 2.

In some embodiments, the first barrier layer 104, the first undoped material 406, the second barrier material 408, and/or the doped material 420 may be deposited by an epitaxial process and/or another form of a deposition process (e.g., chemical vapor deposition (CVD), metal organic chemical vapor deposition (MO-CVD), plasma enhanced chemical vapor deposition (PE-CVD), atomic layer deposition (ALD), physical vapor deposition (PVD), sputtering, electron beam/thermal evaporation, etc.).

Figure 5:
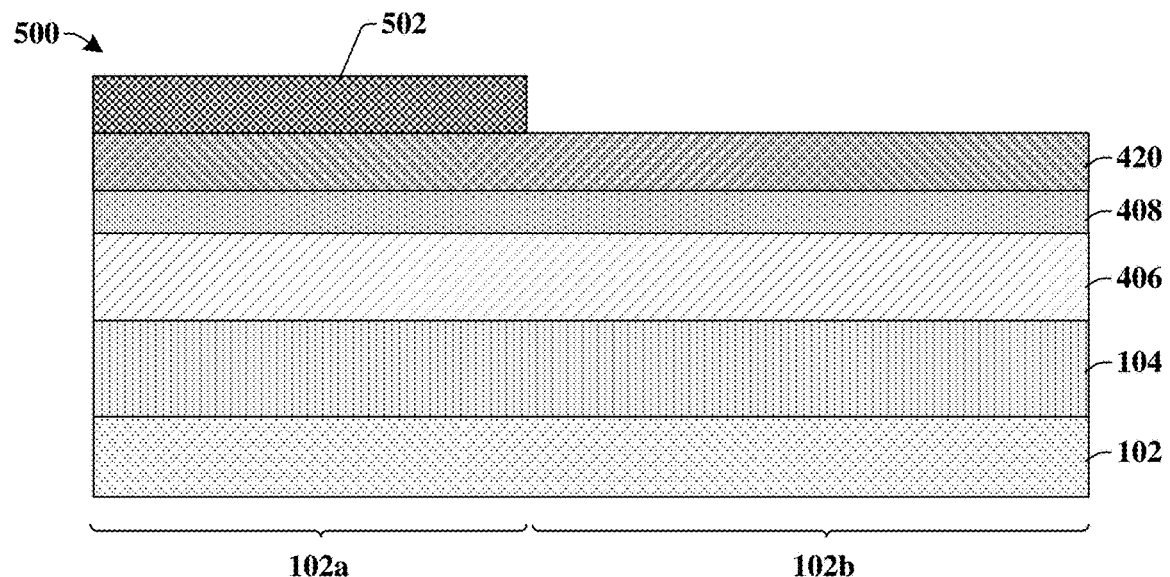

As shown in the cross-sectional view 500 of FIG. 5, a first masking layer 502 may be formed over a n-channel device region 102a of the substrate 102, whereas a p-channel device region 102b of the substrate 102 may remain uncovered. The n-channel device region 102a of the substrate 102 may be laterally beside and continuously connected to the p-channel device region 102b of the substrate 102, as the n-channel and p-channel device regions 102a, 102b are parts of the same substrate 102. In some embodiments, the first masking layer 502 may comprise a photosensitive material (e.g., photoresist) formed by a spin coating process over the doped material 420. In such embodiments, the layer of photosensitive material is selectively exposed to electromagnetic radiation according to a photomask. The electromagnetic radiation may modify a solubility of exposed regions within the photosensitive material to define soluble regions. The photosensitive material may then be subsequently developed to define openings within the photosensitive material by removing the soluble regions. In other embodiments, the first masking layer 502 may comprise a hard mask layer (e.g., a silicon nitride layer, a silicon carbide layer, or the like).

Figure 6:
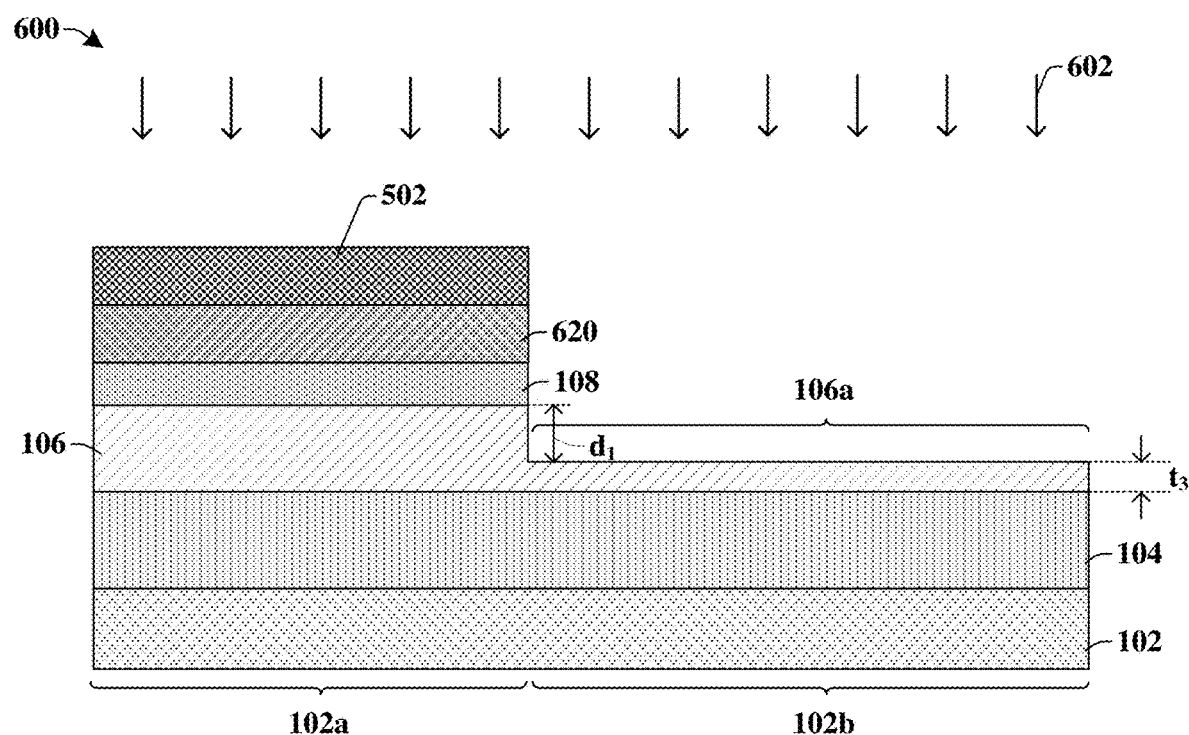

As shown in the cross-sectional view 600 of FIG. 6, a first etch process 602 may be performed to remove the doped material (420 of FIG. 5) on the p-channel device region 102b of the substrate 102 and to remove an upper portion of the first undoped material (406 of FIG. 5) on the p-channel device region 102b of the substrate 102. In some embodiments, the first etch process 602 may be a wet etch or a dry etch. After the first etch process 602, on the n-channel device region 102a of the substrate 102, a patterned doped layer 620 is arranged over a second barrier layer 108, the second barrier layer 108 is arranged over a first undoped layer 106, and the first undoped layer 106 is arranged over the first barrier layer 104. On the p-channel device region 102b of the substrate 102, a thin section 106a of the first undoped layer 106 is arranged over the first barrier layer 104. In some embodiments, the thin section 106a of the first undoped layer 106 may have a third thickness $t_3$ in a range of between approximately 10 nanometers and approximately 30 nanometers.

Thus, in some embodiments, the first etch process 602 may be controlled to remove a first distance $d_1$ of the first undoped material (406 of FIG. 5) on the p-channel device region 102b of the substrate 102. In some embodiments, the first distance $d_1$ may be in a range of between, for example, approximately 270 nanometers and approximately 990 nanometers. In some embodiments, the thin section 106a may be correspond to a p-channel device region of the first undoped layer 106, as the thin section 106a is arranged over the p-channel device region 102b of the substrate 102, which laterally surrounds a portion (e.g., n-channel device region of the first undoped layer 106) of the first undoped layer 106 arranged over the n-channel device region 102a of the substrate 102.

The third thickness $t_3$ of the thin section 106a may allow the p-channel device region 102b of the substrate 102 to form a 2DHG during operation in enhancement mode. If the third thickness $t_3$ is too large (e.g., greater than 30 nanometers), in some embodiments, a 2DHG may not form on the p-channel device region 102b of the substrate 102, and thus, the p-channel device region 102b of the substrate 102 would be unreliable. The first undoped layer 106 on the n-channel device region 102a of the substrate 102 is thicker than the thin section 106a because, in some embodiments, the n-channel device region 102a of the substrate 102 relies on a first undoped layer 106 that is thicker (e.g., greater than 30 nanometers) to form a 2DEG during operation in enhancement mode.

Figure 7:
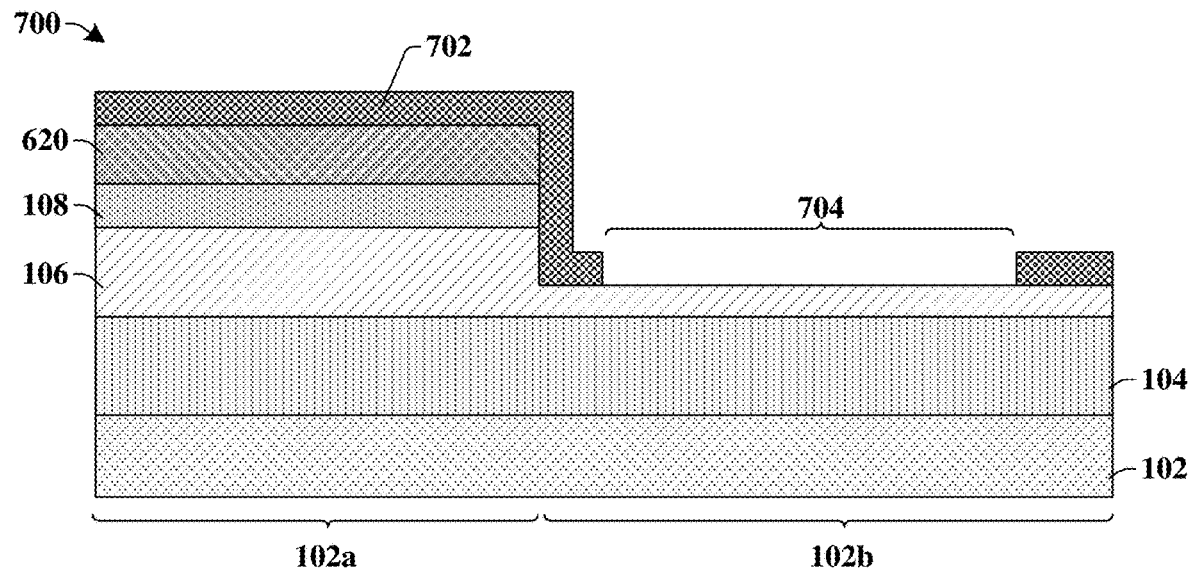

As shown in the cross-sectional view 700 of FIG. 7, the first masking layer (502 of FIG. 5) may be removed in some embodiments, and a second masking layer 702 may be formed over the patterned doped layer 620 and the first undoped layer 106. The second masking layer 702 also covers sidewalls of the patterned doped layer 620, the second barrier layer 108, and the first undoped layer 106. An opening 704 in the second masking layer 702 exposes the first undoped layer 106 on the p-channel device region 102b of the substrate 102. In some embodiments, the second masking layer 702 may be deposited and patterned using similar photolithography techniques as the formation of the first masking layer (502 of FIG. 5). The second masking layer 702 may a hard mask and may be an amorphous material, in some embodiments.

Figure 8:
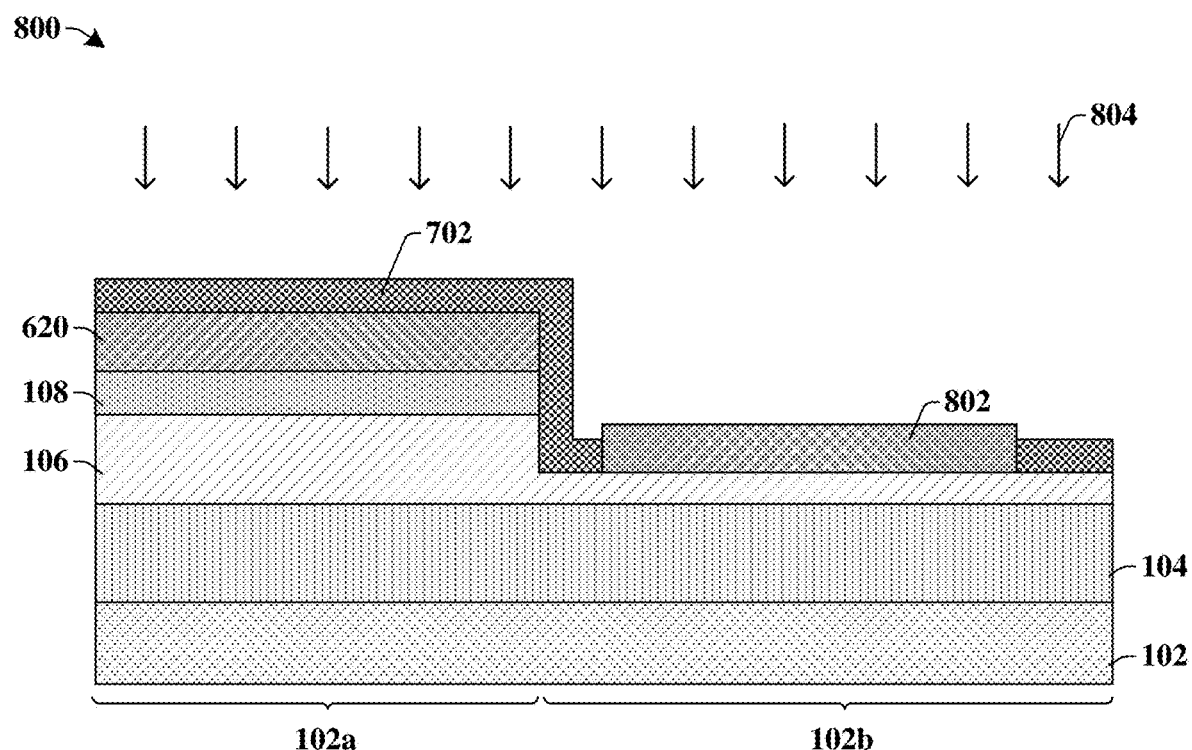

As shown in the cross-sectional view 800 of FIG. 8, a selective epitaxial growth process 804 may be performed to selectively deposit a selective doped layer 802 within the opening (704 of FIG. 7) of the second masking layer 702 on the p-channel device region 102b of the substrate 102. The selective epitaxial growth process 804 may be an epitaxial process or another form of a deposition process (e.g., chemical vapor deposition (CVD), metal organic chemical vapor deposition (MO-CVD), plasma enhanced chemical vapor deposition (PE-CVD), atomic layer deposition (ALD), physical vapor deposition (PVD), sputtering, electron beam/thermal evaporation, etc.). The selective epitaxial growth process 804 may be selective to the first undoped layer 106, such that the selective doped layer 802 directly contacts the first undoped layer 106 because the first undoped layer 106 may be a crystalline material. The selective epitaxial growth process 804 may prevent the selective doped layer 802 from forming on the second masking layer 702 because the second masking layer 702 is an amorphous material.

In some embodiments, the selective doped layer 802 comprises a p-type binary III-V semiconductor material, such as, for example, aluminum nitride, indium nitride, gallium nitride, or the like. In some embodiments, the selective doped layer 802 may comprise a same material as the patterned doped layer 620, whereas in other embodiments, the selective doped layer 802 may comprise a different material than the patterned doped layer 620. In some embodiments, the selective doped layer 802 may be formed to a thickness that is less than approximately 30 nanometers, for example. In some embodiments, the selective doped layer 802 is below the patterned doped layer 620.

Figure 9:
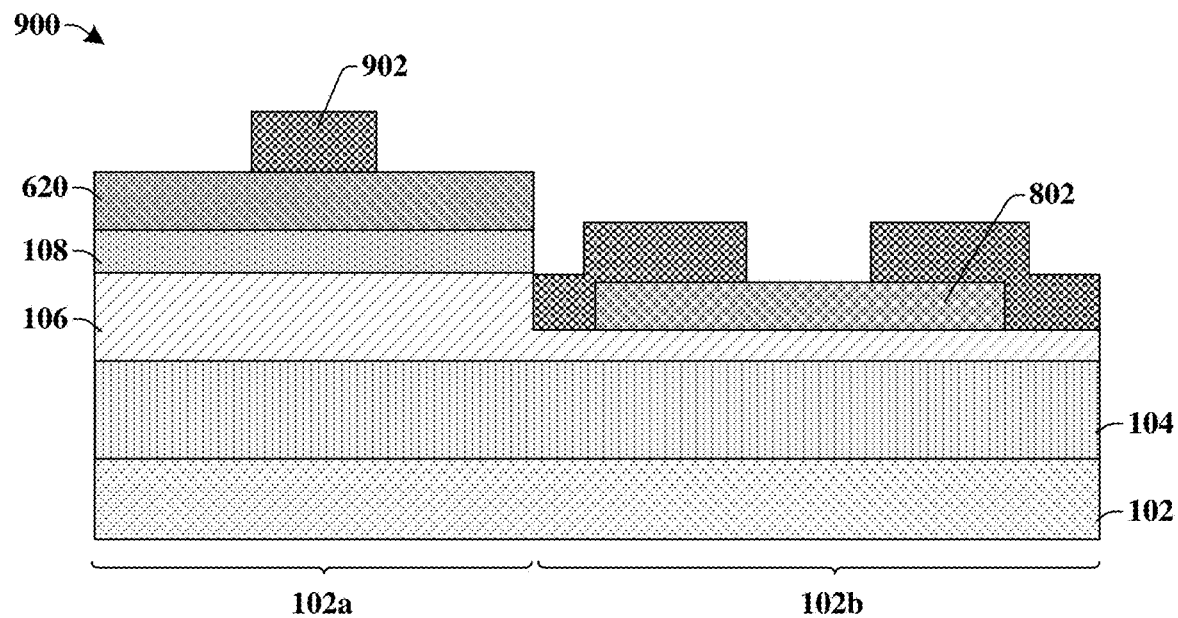

As shown in the cross-sectional view 900 of FIG. 9, a third masking layer 902 may be formed over portions of the patterned doped layer 620 and the selective doped layer 802, whereas other portions of the patterned doped layer 620 and the selective doped layer 802 remain uncovered. The third masking layer 902 may be deposited and patterned using similar photolithography techniques as the formation of the first masking layer (502 of FIG. 5).

Figure 10:
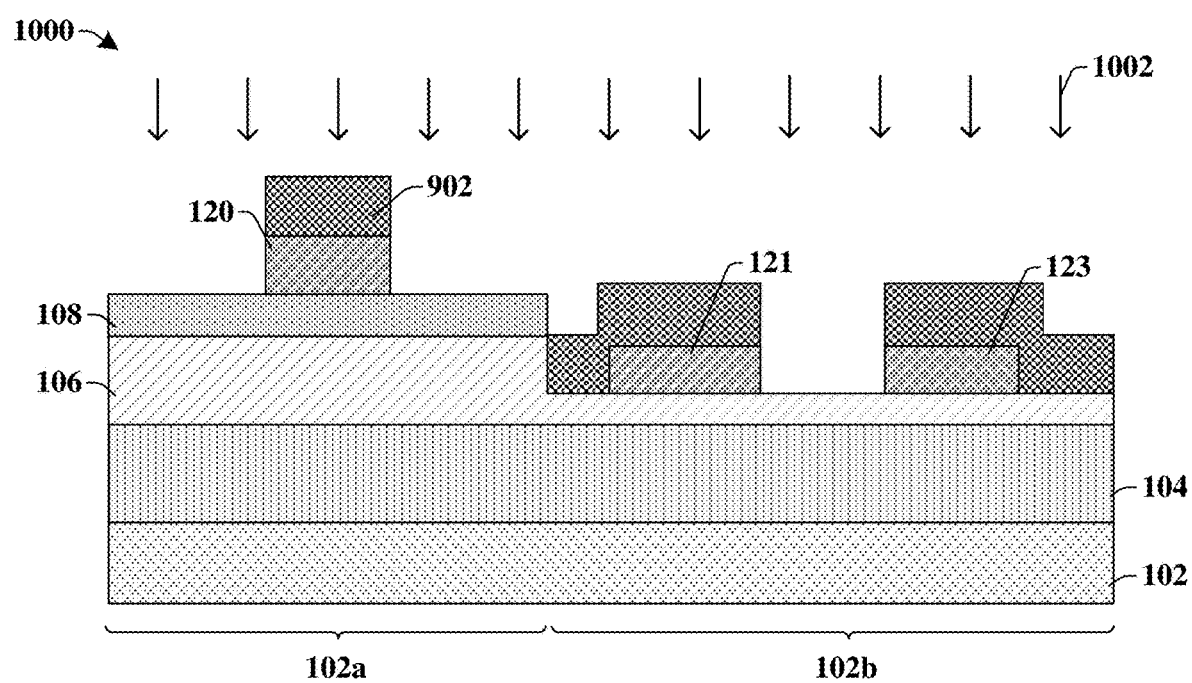

As shown in the cross-sectional view 1000 of FIG. 10, a second etch process 1002 may be performed according to the third masking layer 902. In some embodiments, the second etch process 1002 may be a dry etch or a wet etch and may be selective to the selective doped layer (802 of FIG. 9) and the patterned doped layer (620 of FIG. 9). Thus, after the second etch process 1002, portions of the selective doped layer (802 of FIG. 9) and the patterned doped layer (620 of FIG. 9) are removed, thereby forming a first doped layer 120 over the second barrier layer 108 and second and third doped layers 121, 123 over the first undoped layer 106.

Figure 11:
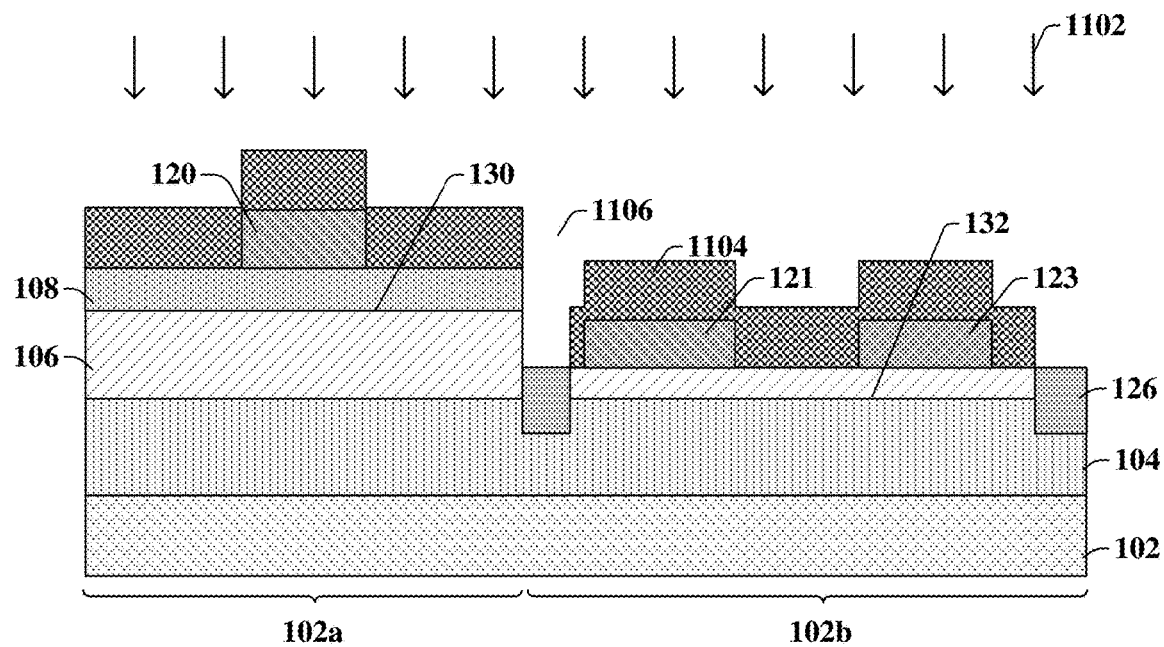

As shown in the cross-sectional view 1100 of FIG. 11, a fourth masking layer 1104 may be formed over the first, second, and third doped layers 120, 121, 123. The fourth masking layer 1104 may comprise a first opening 1106. In some embodiments, from a top-view perspective, the first opening 1106 may be a continuous, ring-like shape surrounding the second and third doped layers 121, 123. An isolation implantation process 1102 may be conducted over the fourth masking layer 1104, such that isolation regions 126 are formed within the first opening 1106 in the fourth masking layer 1104. The fourth masking layer 1104 may block the isolation implantation process 1102 from affecting other features of the cross-sectional view 1100. The isolation implantation process 1102 may, in some embodiments, include implanting iron, chlorine, fluorine, or the like, into the first undoped layer 106 that is uncovered by the fourth masking layer 1104. In other embodiments, the isolation implantation process 1102 may involve the formation of shallow trench isolation (STI) structures such that the isolation regions 126 comprise silicon dioxide.

In some embodiments, the isolation regions 126 may also be a continuous, ring-like shape surrounding the second and third doped layers 121, 123. In some embodiments, the isolation regions 126 may extend from a top surface of the first undoped layer 106 on the p-channel device region 102b of the substrate 102 to the first barrier layer 104. In some embodiments, the isolation regions 126 extend through a second heterojunction 132 at the interfaces between the first undoped layer 106 and the second and third doped layers 121, 123 and into the first barrier layer 104. Thus, the isolation regions 126 may separate the second heterojunction 132 from a first heterojunction 130 along an interface between the second barrier layer 108 and the first undoped layer 106 to prevent cross-talk and/or parasitic channels between a first device on the n-channel device region 102a of the substrate 102 and a second device on the p-channel device region 102b of the substrate 102.

Figure 12:
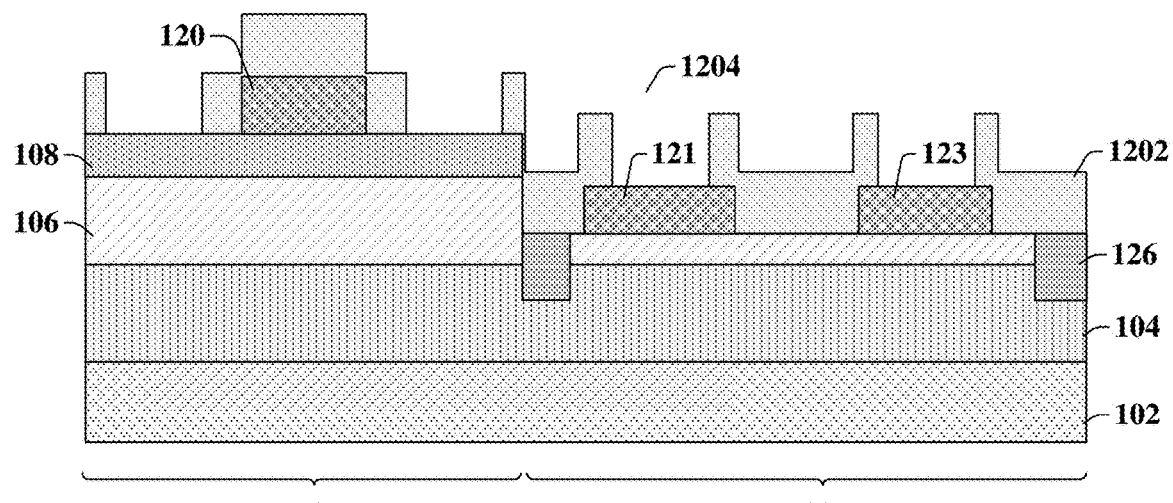

As shown in the cross-sectional view 1200 of FIG. 12, a dielectric layer 1202 may be formed that defines contact openings 1204. The contact openings 1204 may be patterned, such that the contact openings 1204 overlie the second barrier layer 108 on either side of the first doped layer 120 and overlie the second and third doped layers 121, 123. The dielectric layer 1202 defining the contact openings 1204 may be formed through deposition and photolithography processes. In some embodiments, the dielectric layer 1202 may comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

Figure 13:
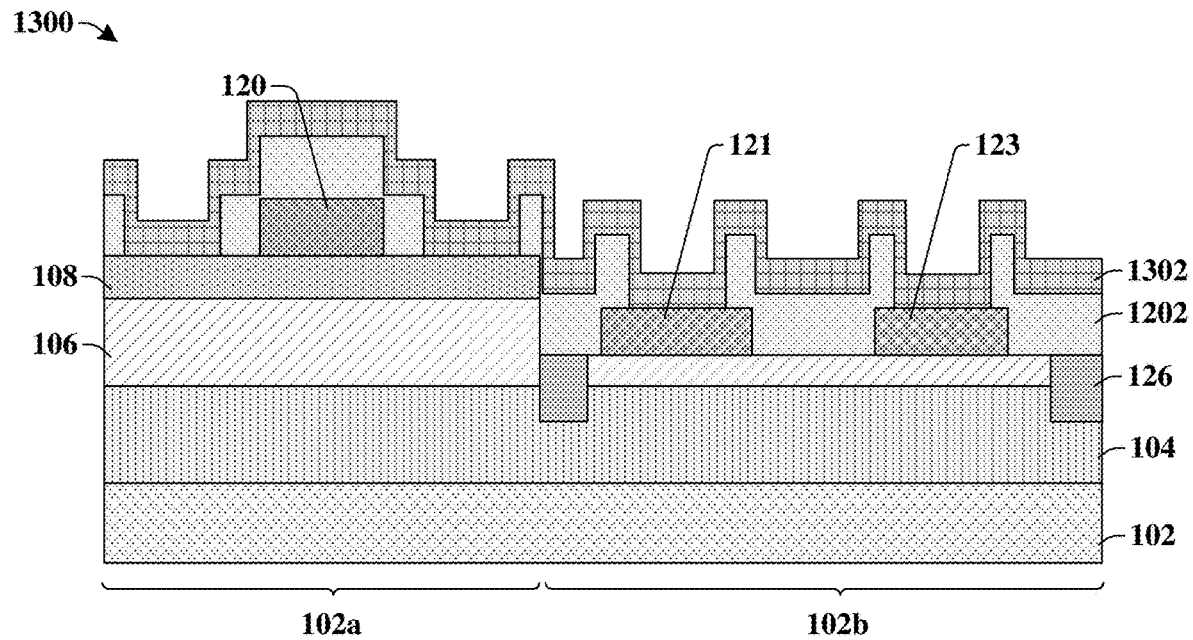

As shown in the cross-sectional view 1300 of FIG. 13, a conductive layer 1302 may be formed over the dielectric layer 1202 and within the contact openings 1204. In some embodiments, the conductive layer 1302 may comprise, for example, a material that creates an Ohmic contact with the second barrier layer 108 and the second and third doped layers 121, 123, such as, for example, titanium or aluminum. In other embodiments, the conductive layer 1302 may comprise, for example, copper, tungsten, or the like. The conductive layer 1302 may be formed by a deposition process (e.g., chemical vapor deposition (CVD), plasma enhanced chemical vapor deposition (PE-CVD), atomic layer deposition (ALD), physical vapor deposition (PVD), etc.).

Figure 14:
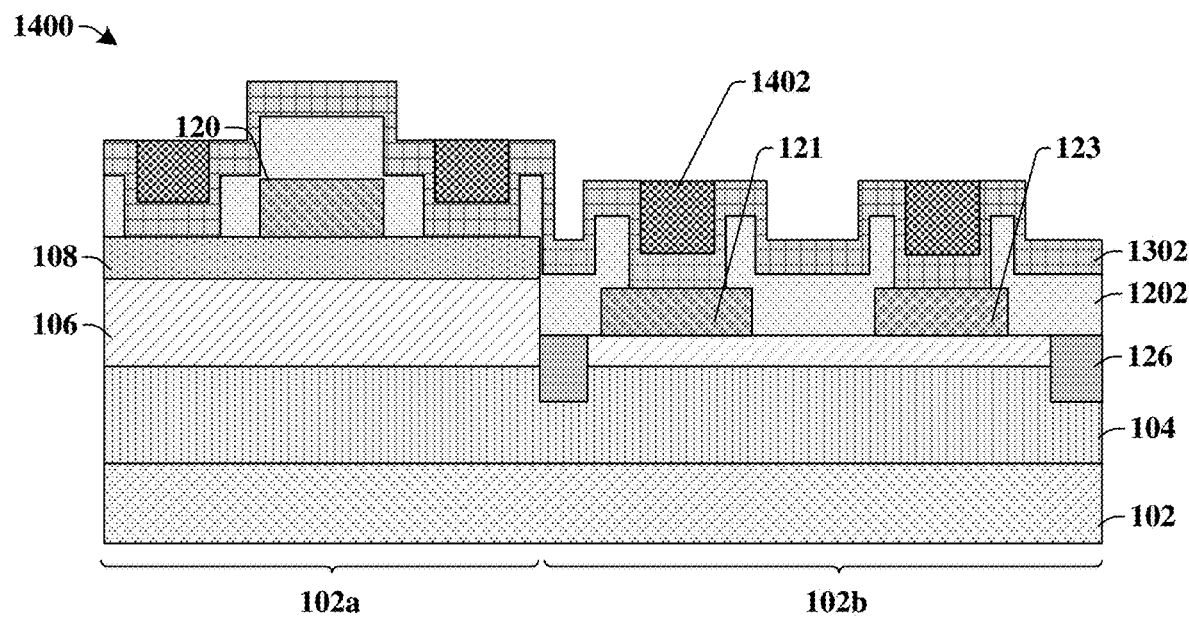

As shown in the cross-sectional view 1400 of FIG. 14, a fifth masking layer 1402 may be formed over the conductive layer 1302. In some embodiments, the fifth masking layer 1402 may have been formed by deposition and photolithography processes to overlie the contact openings (1204 of FIG. 12).

Figure 15:
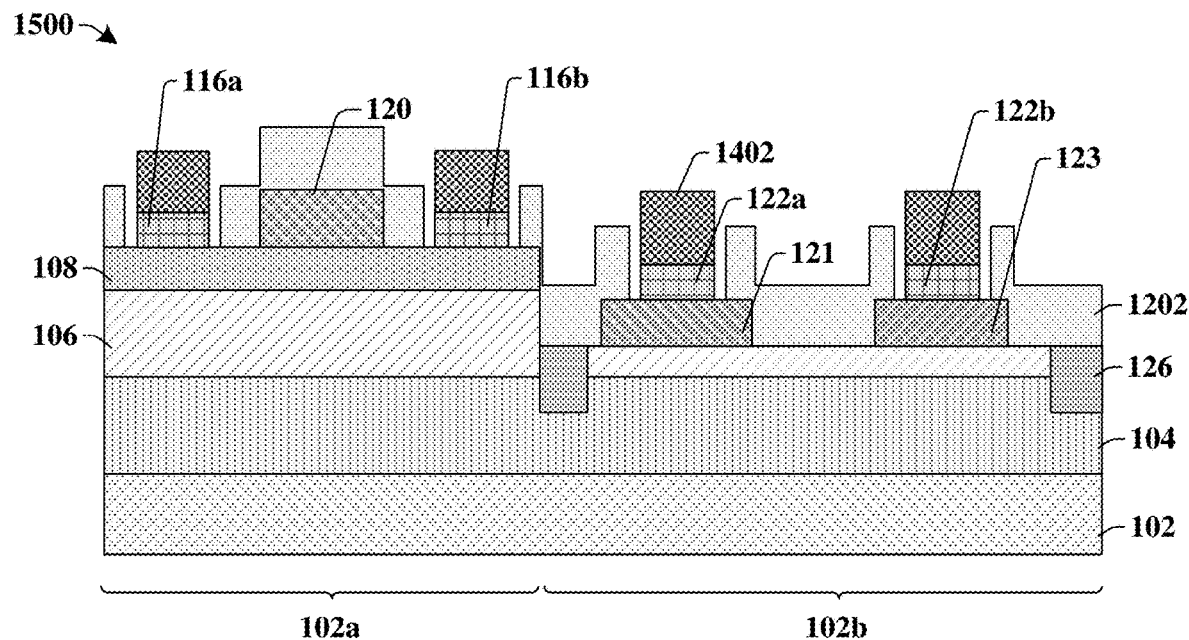

As shown in the cross-sectional view 1500 of FIG. 15, a third etch process may be performed that is selective to the conductive layer (1302 of FIG. 14) to remove the conductive layer (1302 of FIG. 14) that is unprotected by the fifth masking layer 1402. In some embodiments, the third etch process may comprise a wet etchant or a dry etchant. After the third etch process, the remaining conductive layer (1302 of FIG. 14) defines a first contact 116a, a second contact 116b, a third contact 122a, and a fourth contact 122b. Thus, in some embodiments, the first, second, third, and fourth contacts 116a, 116b, 122a, 122b may comprise a same material.

Figure 16:
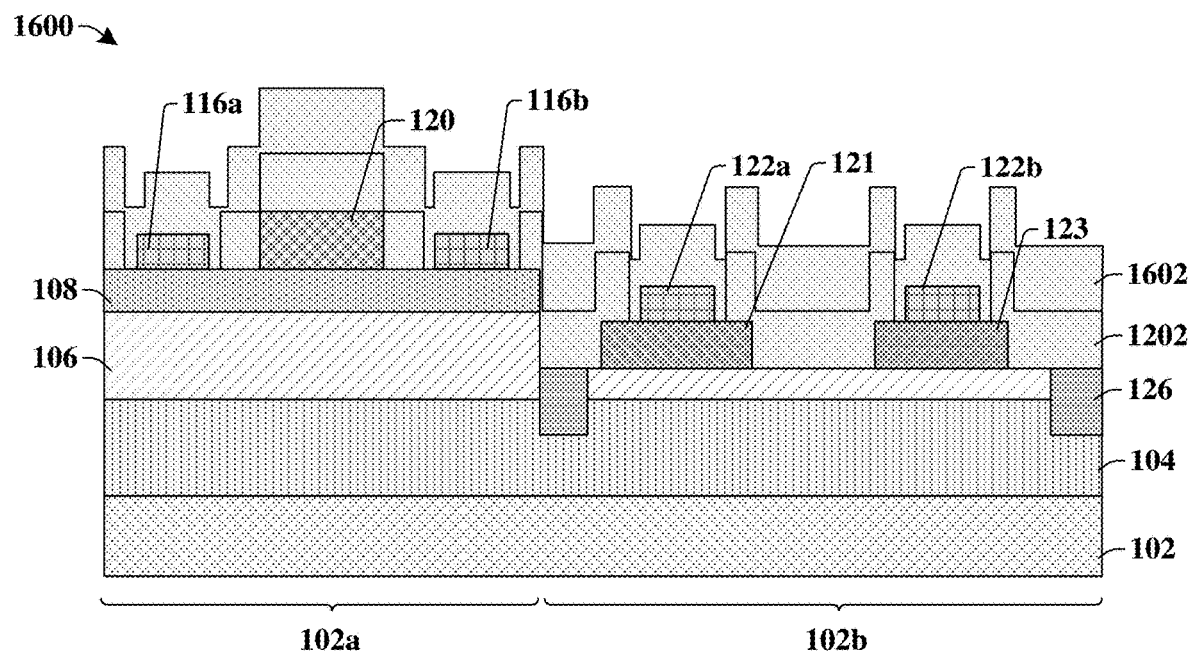

As shown in the cross-sectional view 1600 of FIG. 16, the fifth masking layer (1402 of FIG. 15) is removed (e.g., stripped), and an additional dielectric layer 1602 is deposited over the dielectric layer 1202. The additional dielectric layer 1602 may be formed the same way the dielectric layer 1202 is formed and also comprise the same material as the dielectric layer 1202.

Figure 17:
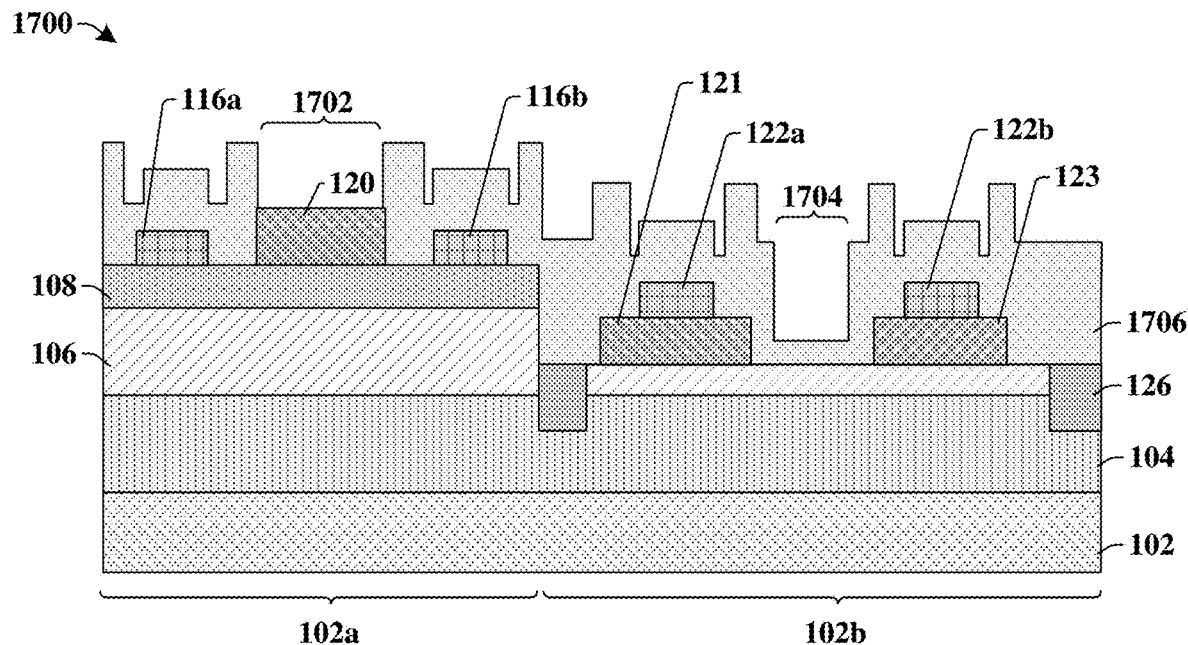

As shown in the cross-sectional view 1700 of FIG. 17, a first gate opening 1702 and a second gate opening 1704 may be formed in multiple dielectric layers 1706. The multiple dielectric layers 1706 comprise the dielectric layer (1202 of FIG. 16) and the additional dielectric layer (1602 of FIG. 16). In some embodiments, a masking layer (not shown) and subsequent etching may be used to remove portions of the multiple dielectric layers 1706 to define the first and second gate openings 1702, 1704. In some embodiments, the first gate opening 1702 may expose the first doped layer 120 on the n-channel device region 102a of the substrate, and the second gate opening 1704 may be arranged between the second and third doped layers 121, 123. However, in some embodiments, the second gate opening 1704 may not completely extend through the multiple dielectric layers 1706. Thus, in some embodiments, the second gate opening 1704 may have a bottom surface defined by the multiple dielectric layers 1706.

Figure 18:
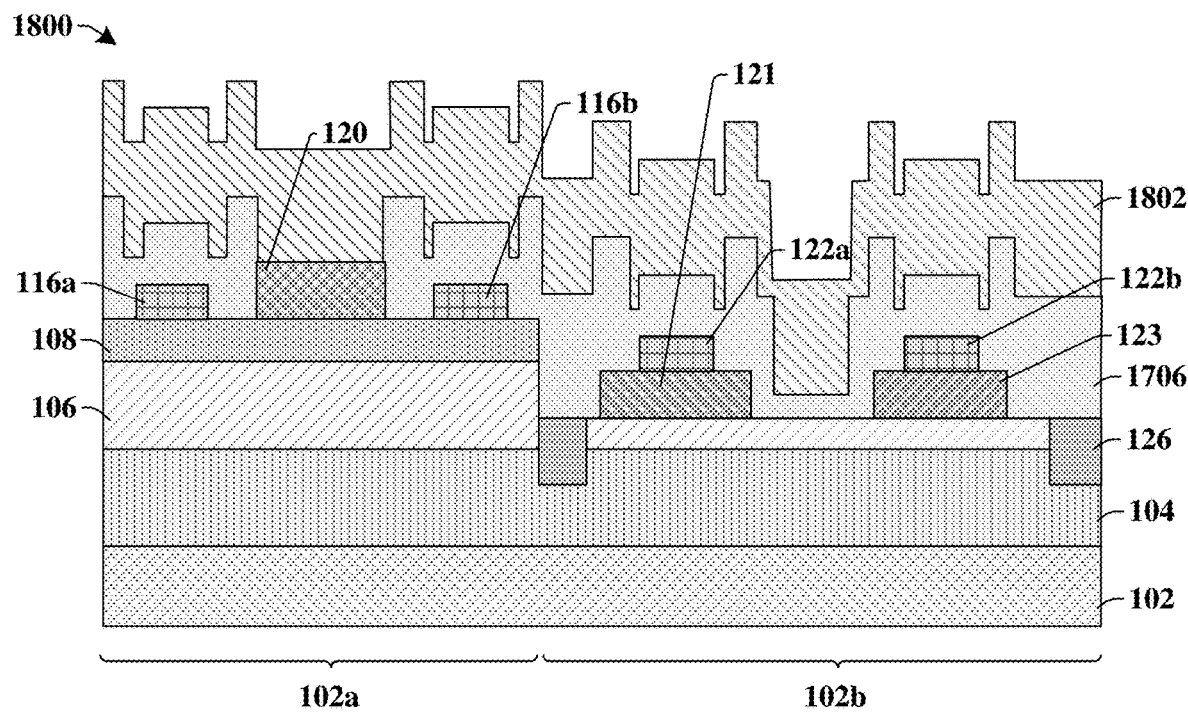

As shown in the cross-sectional view 1800 of FIG. 18, a gate layer 1802 may be deposited over the multiple dielectric layers 1706 and to fill the first gate opening (1702 of FIG. 17) and the second gate opening (1704 of FIG. 17). In some embodiments, the gate layer 1802 may comprise a conductive material, such as, for example, titanium nitride, nickel, tungsten, titanium, or platinum. In some embodiments, the gate layer 1802 may form a Schottky contact with the first doped layer 120 and/or the multiple dielectric layers 1706. However, in other embodiments, the gate layer 1802 is not limited to materials that form Schottky contacts. The gate layer 1802 may be formed by a deposition process (e.g., chemical vapor deposition (CVD), plasma enhanced chemical vapor deposition (PE-CVD), atomic layer deposition (ALD), physical vapor deposition (PVD), etc.).

Figure 19:
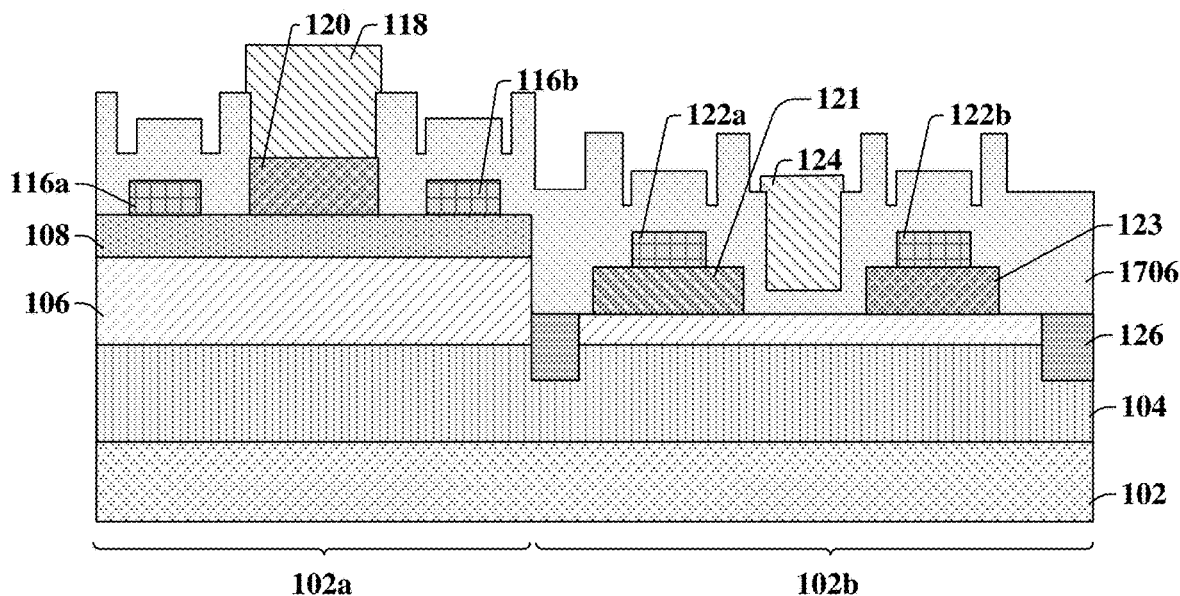

As shown in the cross-sectional view 1900 of FIG. 19, the gate layer (1802 of FIG. 18) may be patterned to form a first gate electrode 118 over the first doped layer 120 and a second gate electrode 124 over the multiple dielectric layers 1706 and between the second and third doped layers 121, 123. In some embodiments, the gate layer (1802 of FIG. 18) may be patterned using photolithography and etch processes. In some embodiments, the first gate electrode 118 and the second gate electrode 124 may have upper portions that are wider than lower portions.

Figure 20:
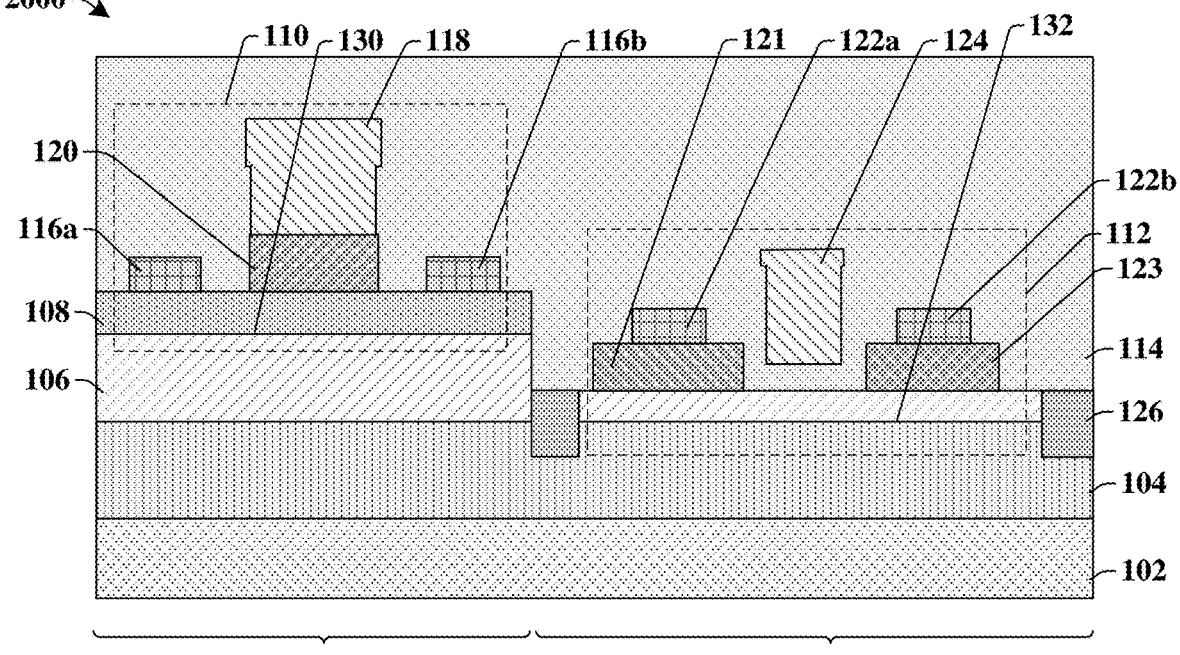

As shown in the cross-sectional view 2000 of FIG. 20, additional dielectric material may be deposited over the multiple dielectric layers (1706 of FIG. 19), thereby forming a dielectric structure 114 over the substrate 102. Thus, the dielectric structure 114 may cover the first and second gate electrodes 118, 124, resulting in an n-channel device 110 arranged over the n-channel device region 102a of the substrate 102 isolated from a p-channel device 112 arranged over the p-channel device region 102b of the substrate 102.

Further, because the second barrier layer 108 is thin (e.g., less than 30 nanometers), a 2DEG is formed along the first heterojunction 130 during operation on the n-channel device 110, and a 2DHG parasitic channel does not form on the n-channel device region 102a of the substrate 102. Similarly, because the first barrier layer 104 is in direct contact with the substrate 102, a 2DHG is formed along the second heterojunction 132 during operation on the p-channel device, and a 2DEG parasitic channel does not form on the p-channel device region 102b of the substrate 102. By isolating the p-channel device 112 from the n-channel device 110 and by preventing parasitic channels from forming in the p-channel device 112 and the n-channel device, the integrated HEMT device in the cross-sectional view 2000 of FIG. 20 is a reliable device with optimal sheet resistances along the first and second heterojunctions 130, 132 and minimal current leakage.

Figure 21:
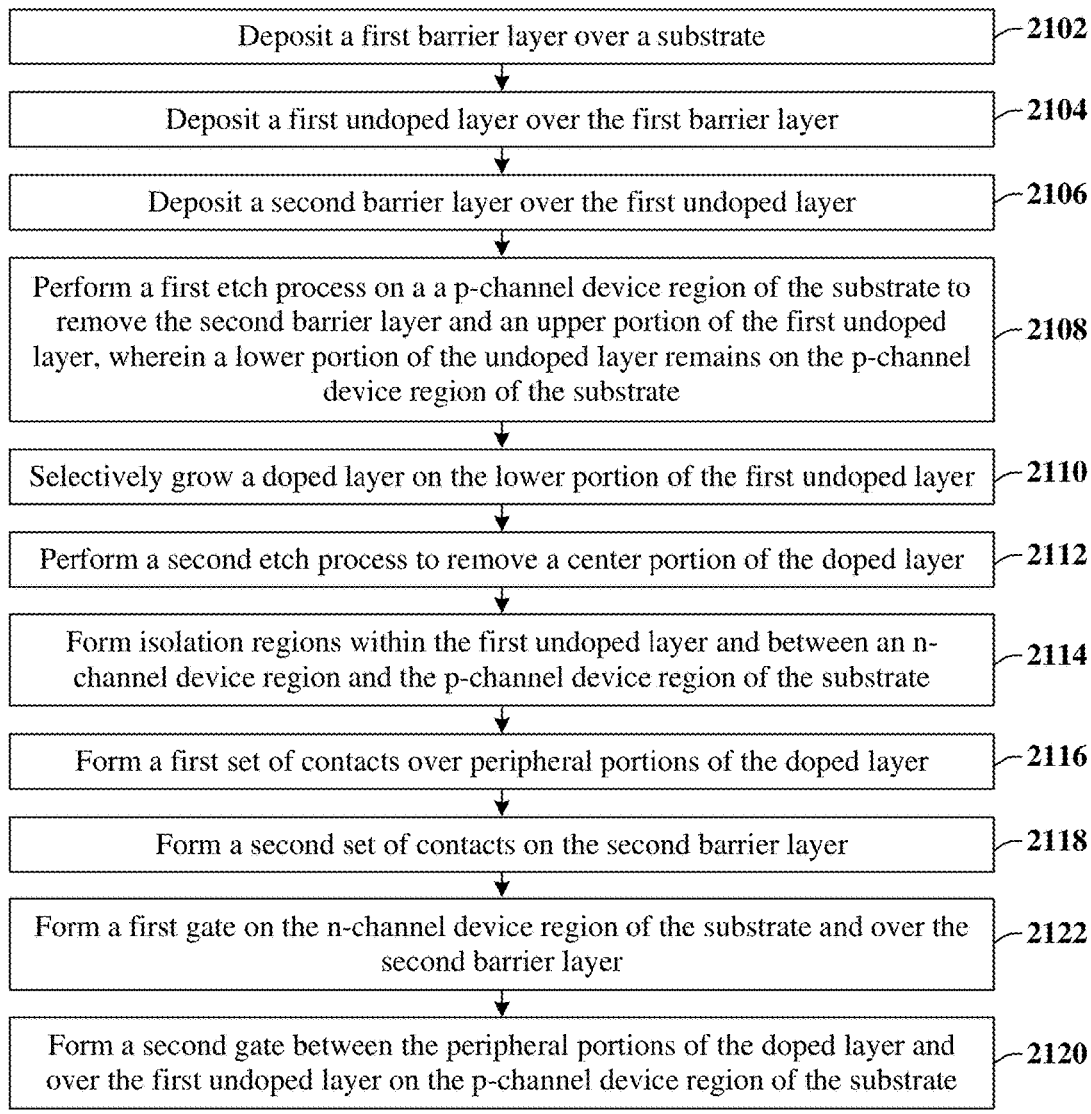
FIG. 21 illustrates a flow diagram of some embodiments corresponding to the method in FIGS. 4-20.

FIG. 21 illustrates a flow diagram of some embodiments of a method 2100 of forming an integrated HEMT device comprising an n-channel device and a p-channel device on a same substrate.

While method 2100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2102, a first barrier layer is deposited over a substrate.

At act 2104, a first undoped layer is deposited over the first barrier layer.

At act 2106, a second barrier layer is deposited over the first undoped layer. FIG. 4 illustrates the cross-sectional view 400 of some embodiments corresponding to acts 2102, 2104, and 2106.

At act 2108, a first etch process is performed on a p-channel device region of the substrate to remove the second barrier layer and an upper portion of the first undoped layer, wherein a lower portion of the undoped layer remains on the p-channel device region of the substrate. FIG. 6 illustrates the cross-sectional view 600 of some embodiments corresponding to act 2108.

At act 2110, a doped layer is selectively grown on the lower portion of the first undoped layer. FIG. 8 illustrates a cross-sectional view 800 of some embodiments corresponding to act 2110.

At act 2112, a second etch process is performed to remove a center portion of the doped layer. FIG. 10 illustrates a cross-sectional view 1000 of some embodiments corresponding to act 2112.

At act 2114, isolation regions are formed within the first undoped layer and between an n-channel device region and the p-channel device region of the substrate. FIG. 11 illustrates a cross-sectional view 1100 of some embodiments corresponding to act 2114.

At act 2116 a first set of contacts are formed over peripheral portions of the doped layer.

At act 2118, a second set of contacts are formed on the second barrier layer. FIGS. 12-15 illustrate cross-sectional views 1200-1500 of some embodiments corresponding to acts 2116 and 2118.

At act 2120, a first gate is formed on the n-channel device region of the substrate and over the second barrier layer.

At act 2122, a second gate is formed between the peripheral portions of the doped layer and over the first undoped layer on the p-channel device region of the substrate. FIGS. 16-19 illustrate cross-sectional views 1600-1900 of some embodiments corresponding to acts 2120 and 2122.

Therefore, the present disclosure relates to a new method of manufacturing an integrated HEMT device comprising an n-channel device and a p-channel device on a same substrate without the formation of parasitic channels in order to produce a reliable integrated HEMT device.

Accordingly, in some embodiments, the present disclosure relates to an integrated transistor device, comprising: a first barrier layer arranged over a substrate; an undoped layer arranged over the first barrier layer, wherein the undoped layer has a n-channel device region laterally next to a p-channel device region, wherein the n-channel device region of the undoped layer has a topmost surface that is above a topmost surface of the p-channel device region of the undoped layer; a second barrier layer over the n-channel device region of the undoped layer; a first gate electrode arranged over the second barrier; and a second gate electrode arranged over the p-channel device region of the undoped layer.

In other embodiments, the present disclosure relates to an integrated transistor device, comprising: a first III-V semiconductor layer arranged over a substrate; an undoped binary III-V semiconductor layer arranged over the first III-V semiconductor layer, wherein the undoped binary III-V semiconductor layer has a n-channel device region laterally beside a p-channel device region, wherein the n-channel device region has a greater thickness than the p-channel device region; a second III-V semiconductor layer arranged over the n-channel device region of the undoped binary III-V semiconductor layer; a doped binary III-V source region and a doped binary III-V drain region arranged over the p-channel device region of the undoped binary III-V semiconductor layer; a first gate electrode arranged over the second III-V semiconductor layer; and a second gate electrode arranged over the undoped binary III-V semiconductor layer and between the doped binary III-V source region and the doped binary III-V drain region.

In yet other embodiments, the present disclosure relates to a method of forming an integrated transistor device, comprising: depositing a first barrier layer over a substrate, wherein the substrate comprises a n-channel device region laterally next to and continuously connected to a p-channel device region; depositing an undoped layer over the first barrier layer; depositing a second barrier layer over the undoped layer; performing a first etch process on the p-channel device region of the substrate to remove the second barrier layer on the p-channel device region of the substrate and to remove an upper portion of the undoped layer on the p-channel device region of the substrate, wherein a lower portion of the undoped layer on the p-channel device region of the substrate has an upper surface below an uppermost surface of the undoped layer on the n-channel device region of the substrate; selectively forming a doped layer over the lower portion of the undoped layer on the p-channel device region of the substrate; forming a first gate electrode arranged over the second barrier layer; and forming a second gate electrode arranged over the lower portion of the undoped layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A high-electron mobility transistor (HEMT) device, comprising:
a first III-V semiconductor layer arranged over a substrate;
an undoped binary III-V semiconductor layer arranged over the first III-V semiconductor layer, wherein the undoped binary III-V semiconductor layer has a n-channel device region laterally beside a p-channel device region, wherein the n-channel device region has a greater thickness than the p-channel device region;
a second III-V semiconductor layer arranged over the n-channel device region of the undoped binary III-V semiconductor layer;
a doped binary III-V source region and a doped binary III-V drain region arranged over the p-channel device region of the undoped binary III-V semiconductor layer;
a first gate electrode arranged over the second III-V semiconductor layer; and
a second gate electrode arranged over the undoped binary III-V semiconductor layer and between the doped binary III-V source region and the doped binary III-V drain region.

2. HEMT device of claim 1, wherein a top surface of the first gate electrode is above a top surface of the second gate electrode.

3. The HEMT device of claim 1, wherein an isolation region is arranged between the first gate electrode and the second gate electrode and extends from a top surface of the p-channel device region of the undoped binary III-V semiconductor layer to the first III-V semiconductor layer.

4. The HEMT device of claim 1, further comprising:
a doped binary III-V gate region arranged between the second III-V semiconductor layer and the first gate electrode.

5. The HEMT device of claim 4, wherein the doped binary III-V gate region has a doping concentration less than approximately $10^{18}$ p-type dopants per cubic centimeter.

6. A method of forming an integrated transistor device, comprising:
depositing a first barrier layer over a substrate, wherein the substrate comprises a n-channel device region laterally next to and continuously connected to a p-channel device region;
depositing an undoped layer over the first barrier layer;
depositing a second barrier layer over the undoped layer;
performing a first etch process on the p-channel device region of the substrate to remove the second barrier layer on the p-channel device region of the substrate and to remove an upper portion of the undoped layer on the p-channel device region of the substrate, wherein a lower portion of the undoped layer on the p-channel device region of the substrate has an upper surface below an uppermost surface of the undoped layer on the n-channel device region of the substrate;
selectively forming a doped layer over the lower portion of the undoped layer on the p-channel device region of the substrate;
forming a first gate electrode arranged over the second barrier layer; and
forming a second gate electrode arranged over the lower portion of the undoped layer.

7. The method of claim 6, further comprising:
performing an isolation process to form an isolation region through the undoped layer and between the first and second gate electrodes.

8. The method of claim 6, further comprising:
forming a doped gate region over the second barrier layer on the n-channel device region of the substrate, wherein the doped gate region is between the first gate electrode and the second barrier layer.

9. The method of claim 8, wherein the doped gate region has a thickness less than approximately 30 nanometers.

10. The method of claim 6, further comprising:
forming multiple buffer layers over the substrate and below the first barrier layer, wherein the multiple buffer layers and the first barrier layer comprise a same quaternary III-V semiconductor material.

11. The method of claim 6, further comprising:
forming a first set of contacts over the second barrier layer and laterally spaced apart from the first gate electrode; and
forming a second set of contacts over the doped layer on the p-channel device region of the substrate, wherein the second gate electrode is between the second set of contacts.

12. A high electron mobility transistor (HEMT) device, comprising:
a first barrier layer arranged over a substrate; and
an undoped layer arranged over the first barrier layer, wherein the undoped layer has a n-channel device region laterally next to a p-channel device region, wherein the n-channel device region of the undoped layer has a topmost surface that is above a topmost surface of the p-channel device region of the undoped layer.

13. The HEMT device of claim 12, wherein the first barrier layer comprises a III-V semiconductor material.

14. The HEMT device of claim 13, wherein the undoped layer comprises a binary III-V semiconductor material.

15. The HEMT device of claim 12, further comprising:
a second barrier layer over the n-channel device region of the undoped layer.

16. The HEMT device of claim 15, wherein the second barrier layer comprises a III-V semiconductor material.

17. The HEMT device of claim 16, wherein the undoped layer comprises a binary III-V semiconductor material.

18. The HEMT device of claim 15, further comprising:
a first gate electrode arranged directly over the second barrier layer; and
a second gate electrode arranged directly over the p-channel device region of the undoped layer.

19. The HEMT device of claim 18, wherein a top surface of the first gate electrode is above a top surface of the second gate electrode.

20. The HEMT device of claim 18, further comprising:
an isolation region arranged between the first gate electrode and the second gate electrode, the isolation region extending from a top surface of the p-channel device region of the undoped layer into the first barrier layer.

* * * * *